United States Patent
Kaneko et al.

(10) Patent No.: US 12,451,348 B2
(45) Date of Patent: Oct. 21, 2025

(54) METHOD AND DEVICE FOR MANUFACTURING SIC SUBSTRATE, AND METHOD FOR REDUCING MACRO-STEP BUNCHING OF SIC SUBSTRATE

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Hyogo (JP); Natsuki Yoshida, Hyogo (JP); Kazufumi Aoki, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 753 days.

(21) Appl. No.: 17/436,309

(22) PCT Filed: Mar. 3, 2020

(86) PCT No.: PCT/JP2020/008964
§ 371 (c)(1),
(2) Date: Sep. 3, 2021

(87) PCT Pub. No.: WO2020/179793
PCT Pub. Date: Sep. 10, 2020

(65) Prior Publication Data
US 2022/0181149 A1    Jun. 9, 2022

(30) Foreign Application Priority Data
Mar. 5, 2019    (JP) .................. 2019-040070

(51) Int. Cl.
*H01L 21/02*    (2006.01)
*C30B 33/12*    (2006.01)

(52) U.S. Cl.
CPC ........ *H01L 21/02378* (2013.01); *C30B 33/12* (2013.01); *H01L 21/02595* (2013.01)

(58) Field of Classification Search
CPC ... C30B 29/36; C30B 33/12; H01L 21/02378; H01L 21/02595
See application file for complete search history.

(56) References Cited

U.S. PATENT DOCUMENTS 5,989,340 A * 11/1999 Stephani ................. C30B 29/36
                                                    117/106
2011/0278594 A1* 11/2011 Nishiguchi ........ H01L 29/66068
                                                    117/106

(Continued)

FOREIGN PATENT DOCUMENTS

CN    109071231 A    12/2018
EP    3879011 A1    9/2021

(Continued)

OTHER PUBLICATIONS

International Search Report for PCT/JP2020/008964 dated Apr. 7, 2020 (4 pages).

(Continued)

*Primary Examiner* — Matthew J Song
(74) *Attorney, Agent, or Firm* — Calfee, Halter & Griswold LLP

(57) ABSTRACT

A device for manufacturing a SiC substrate, in which formation of macro-step bunching is suppressed, comprises: a main body container that is capable of accommodating a SiC substrate and generates, by heating, a vapor pressure of gaseous species containing Si elements and gaseous species containing C elements, in an internal space; and a heating furnace that accommodates the main body container and performs heating so that a vapor pressure of the gaseous species containing Si elements is generated and a temperature gradient is formed, wherein the main body container has (Continued)

an etching space S1 and a Si vapor supply source capable of supplying Si vapor into the main body container, the etching space S1 being formed by making the SiC substrate face a portion of the main body container arranged on a lower-temperature side of the temperature gradient while the SiC substrate is disposed on a higher-temperature side of the temperature gradient.

9 Claims, 4 Drawing Sheets

(56) References Cited

U.S. PATENT DOCUMENTS

| | | | |
|---|---|---|---|
| 2015/0128849 A1* | 5/2015 | Januschewsky | C30B 35/002 117/223 |
| 2016/0118257 A1* | 4/2016 | Kaneko | C30B 29/36 438/492 |
| 2017/0345672 A1 | 11/2017 | Kaneko et al. | |
| 2019/0136409 A1* | 5/2019 | Kaneko | H01L 21/02631 |
| 2019/0136411 A1 | 5/2019 | Kaneko et al. | |
| 2021/0355600 A1* | 11/2021 | Kim | C30B 15/12 |
| 2022/0359667 A1* | 11/2022 | Kaneko | H01L 21/02378 |

FOREIGN PATENT DOCUMENTS

| | | |
|---|---|---|
| JP | H 11087257 A | 3/1999 |
| JP | 2005225710 A | 8/2005 |
| JP | 2008016691 A | 1/2008 |
| JP | 2017066019 A | 4/2017 |
| WO | 2016079983 A1 | 5/2016 |
| WO | WO-2017188381 A1 * | 11/2017 ............. C30B 23/02 |

OTHER PUBLICATIONS

Extended European Search Report issued in the EP application No. 20766086.1 dated Oct. 12, 2022 (13 pages).

* cited by examiner

METHOD AND DEVICE FOR MANUFACTURING SIC SUBSTRATE, AND METHOD FOR REDUCING MACRO-STEP BUNCHING OF SIC SUBSTRATE

CROSS-REFERENCE TO RELATED APPLICATIONS

This application is a 371 of PCT Application No. PCT/JP2020/008964 filed on Mar. 3, 2020, which claims priority to Japanese Application No. 2019-040070, filed on Mar. 5, 2019, the contents of which are hereby incorporated by reference as if recited in their entirety.

TECHNICAL FIELD

The present invention relates to a method for manufacturing a SiC substrate in which formation of macro-step bunching is suppressed, a manufacturing device therefor, and a method for reducing macro-step bunching of a SiC substrate.

BACKGROUND ART

Development of silicon carbide (SiC) semiconductor devices is in progress because SiC semiconductor devices have higher withstand voltage and higher efficiency than silicon (Si) and gallium arsenide (GaAs) semiconductor devices and can operate at higher temperatures.

Usually, a step-terrace structure is formed on the surface of the SiC substrate provided with a slight inclination from (0001) used for device manufacturing. In conventional surface control of a SiC substrate, it has been regarded as a problem that steps are bunched during a device manufacturing process, and step bunching is formed.

This step bunching is known to adversely affect the characteristics of SiC semiconductor devices. Specifically, it is known that (1) when epitaxial growth is performed on a surface on which step bunching is formed, a defect caused by step bunching may occur on a surface of an epitaxial growth layer (hereinafter, referred to as an epilayer), and (2) in a SiC semiconductor device such as a MOSFET manufactured by forming an oxide film on a surface of an epilayer, presence of step bunching may affect operation performance and reliability.

In view of such a problem, various techniques for suppressing the occurrence of step bunching have been proposed. For example, Patent Literature 1 discloses a technique of etching a surface of a SiC substrate to obtain a flat surface at a molecular level by "a heat treatment process of accommodating the single crystal silicon carbide substrate in an accommodation container made of tantalum metal and vertically fitted so as to expose a tantalum carbide layer to an internal space, and uniformly heat-treating the accommodation container at a temperature of equal to or higher than 1500° C. and equal to or lower than 2300° C. in a state where an internal pressure of the accommodation container is maintained at a vacuum higher than an external pressure and under a saturated vapor pressure of silicon".

CITATION LIST

Patent Literature

Patent Literature 1: JP 2008-16691 A

SUMMARY OF INVENTION

Technical Problem

An object of the present invention is to provide a method and a device for manufacturing a SiC substrate in which formation of macro-step bunching is suppressed.

Solution to Problem

In order to solve the above problem, a device for manufacturing a SiC substrate according to an aspect of the present invention includes: a main container capable of accommodating a SiC substrate and configured to generate vapor pressure of a gaseous species containing Si element and a gaseous species containing C element in an internal space by heating; and
a heating furnace that accommodates the main container, generates vapor pressure of a gaseous species containing Si element in an internal space, and performs heating in a manner to form a temperature gradient,
 the main container including an etching space formed by making a portion of the main container arranged on a low temperature side of the temperature gradient face the SiC substrate in a state where the SiC substrate is arranged on a high temperature side of the temperature gradient, and
 a Si vapor supply source capable of supplying Si vapor into the main container.

As described above, by arranging and etching the SiC substrate and the Si vapor supply source in the main container that generates vapor pressure of the gaseous species containing Si element and the gaseous species containing the C element in the internal space by heating, it is possible to perform etching while suppressing formation of macro-step bunching.

In this aspect, the Si vapor supply source is arranged such that an atomic number ratio Si/C in the main container is higher than 1.

As described above, by arranging the Si vapor supply source such that the atomic number ratio Si/C in the main container is higher than 1, it is possible to form a SiC—Si equilibrium vapor pressure environment in the main container.

In this aspect, the main container includes a substrate holder provided between the SiC substrate and the main container.

As described above, by providing the substrate holder between the SiC substrate and the main container, the etching space can be easily formed.

In this aspect, the main container is made of a material containing polycrystalline SiC.

As described above, in a case where the main container is made of a material containing polycrystalline SiC, vapor pressure of a gaseous species containing Si element and a gaseous species containing C element can be generated in the main container when the main container is heated by the heating furnace.

In this aspect, the heating furnace includes a high melting point container capable of accommodating the main container, and a Si vapor supply source capable of supplying Si vapor into the high melting point container.

As described above, since the heating furnace includes the high melting point container and the Si vapor supply source, the main container can be heated under the Si vapor pressure environment. This makes it possible to suppress a decrease in vapor pressure of the gaseous species containing Si element in the main container.

In this aspect, the high melting point container is made of a material containing tantalum, and the Si vapor supply source is tantalum silicide.

The present invention also relates to a method for manufacturing a SiC substrate. That is, a method for manufacturing a SiC substrate according to an aspect of the present invention includes an etching process of etching a SiC substrate by accommodating the SiC substrate and a Si vapor supply source inside a main container that generates vapor pressure of a gaseous species containing Si element and a gaseous species containing C element in an internal space, and heating the main container in a manner to form a temperature gradient under an environment of vapor pressure of the gaseous species containing Si element.

As described above, by arranging and etching the SiC substrate and the Si vapor supply source in the main container that generates vapor pressure of the gaseous species containing Si element and the gaseous species containing the C element in the internal space, it is possible to perform etching while suppressing formation of macro-step bunching.

In this aspect, the Si vapor supply source is arranged such that an atomic number ratio Si/C in the main container is higher than 1.

In this aspect, in the etching process, the SiC substrate is etched under a SiC—Si equilibrium vapor pressure environment.

In this aspect, the etching process includes a Si atom sublimation process of thermally sublimating Si atoms from the surface of the SiC substrate, and a C atom sublimation process of sublimating C atoms from the surface of the SiC substrate by reacting C atoms remaining on the surface of the SiC substrate with Si vapor in the main container.

In this aspect, in the etching process, the SiC substrate arranged on the high temperature side of the temperature gradient and a portion of the main container arranged on the low temperature side of the temperature gradient are etched while facing each other.

The present invention also relates to a method for reducing macro-step bunching in a SiC substrate. That is, a method for reducing macro-step bunching of a SiC substrate according to an aspect of the present invention is a method including an etching process of etching a SiC substrate under a SiC—Si equilibrium vapor pressure environment.

In this aspect, the etching process is a process of performing heating in a temperature range of equal to or higher than 1400° C. and equal to or lower than 2300° C.

In this aspect, the etching process is a process of performing etching by arranging a Si vapor supply source in a manner that the atomic number ratio Si/C in the etching space is higher than 1.

The present invention also relates to a method for manufacturing a SiC substrate. That is, a method for manufacturing a SiC substrate according to an aspect of the present invention includes an etching process of etching a SiC substrate under a SiC—Si equilibrium vapor pressure environment, and the etching process is a process of arranging the SiC substrate in an etching space exhausted through an environment of vapor pressure of a gaseous species containing Si element and performing etching.

In this aspect, the etching process is a process of performing etching by arranging a Si vapor supply source in a manner that the atomic number ratio Si/C in the etching space is higher than 1.

In this aspect, the etching process is a process of heating an etching space in which the SiC substrate is arranged on a high temperature side of a temperature gradient.

The present invention also relates to a device for manufacturing a SiC substrate. That is, a device for manufacturing a SiC substrate according to an aspect of the present invention includes: a main container capable of accommodating a SiC substrate and configured to generate vapor pressure of a gaseous species containing Si element and a gaseous species containing C element in an internal space by heating; and a heating furnace that accommodates the main container, generates vapor pressure of a gaseous species containing Si element in an internal space, and performs heating in a manner to form a temperature gradient, the main container including an etching space in which the SiC substrate is arranged on a high temperature side of the temperature gradient, and a Si vapor supply source capable of supplying Si vapor into the main container.

In this aspect, the Si vapor supply source is arranged such that an atomic number ratio Si/C in the main container is higher than 1.

In this aspect, the main container includes a substrate holder capable of holding at least a part of the SiC substrate in a hollow space of the main container.

Advantageous Effects of Invention

According to the disclosed technology, it is possible to provide a method and a device for manufacturing a SiC substrate in which formation of macro-step bunching is suppressed.

Other problems, features and advantages will become apparent from reading of the following Description of Embodiments when taken up in conjunction with the drawings and claims.

DESCRIPTION OF EMBODIMENTS

Figure 1:
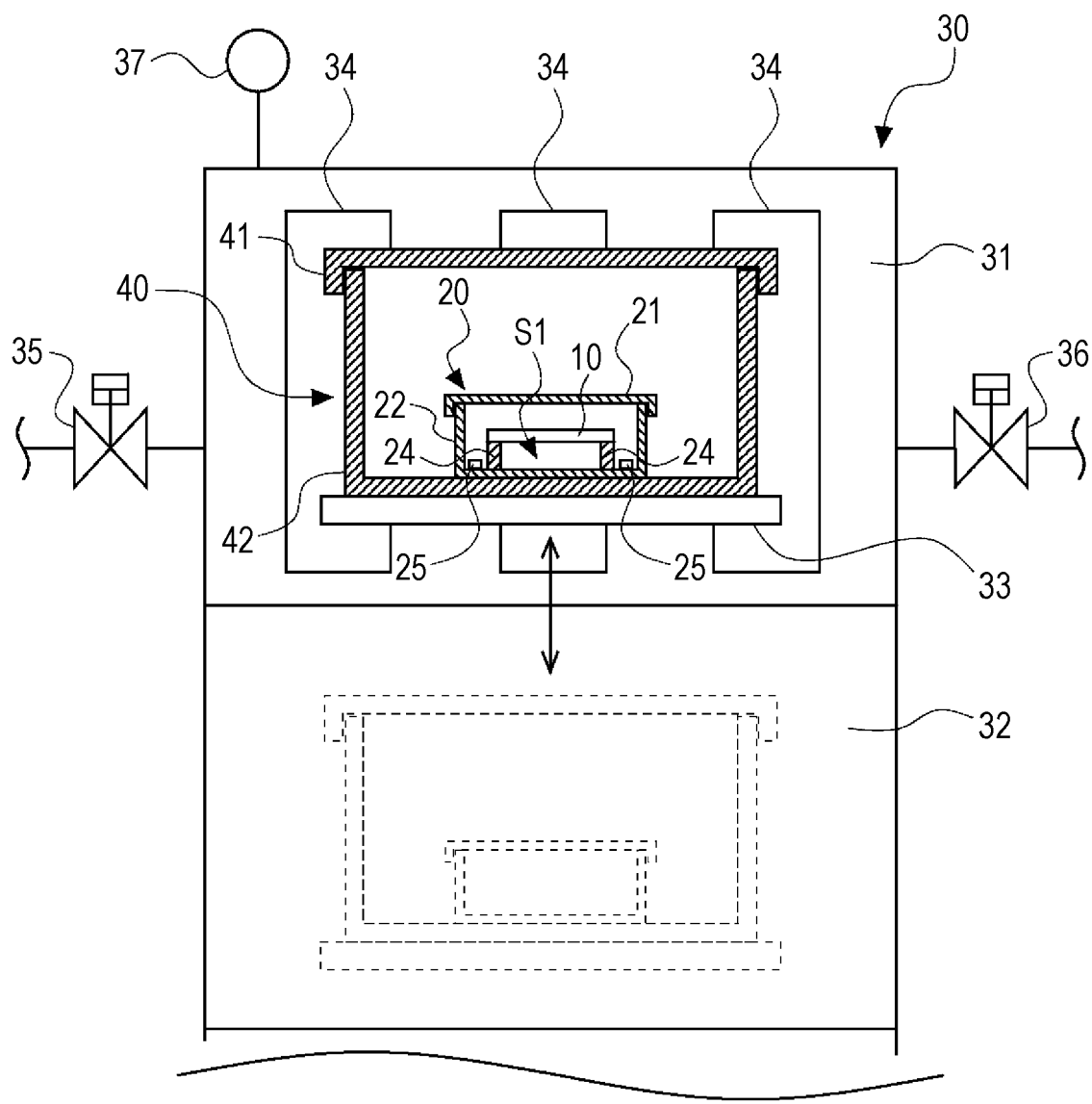
FIG. 1 is a schematic view of a device for manufacturing a SiC substrate according to an embodiment.

Hereinafter, a preferred embodiment of the present invention illustrated in the drawings will be described in detail with reference to FIGS. 1 to 8. The technical scope of the present invention is not limited to the embodiments illustrated in the accompanying drawings, and can be appropriately changed within the scope described in the claims.

[Device for Manufacturing SiC Substrate]

Hereinafter, a device for manufacturing a SiC substrate according to an embodiment of the present invention will be described in detail.

As illustrated in FIG. 1, a device for manufacturing a SiC substrate according to the present embodiment includes: a main container 20 capable of accommodating a SiC substrate 10 and configured to generate vapor pressure of a gaseous species containing Si element and a gaseous species containing C element in an internal space by heating; and a heating furnace 30 that accommodates the main container 20, generates vapor pressure of a gaseous species containing Si element in an internal space, and performs heating in a manner to form a temperature gradient.

The main container 20 includes: an etching space S1 formed by making a portion of the main container 20 arranged on the low temperature side of the temperature gradient face the SiC substrate 10 in a state where the SiC substrate 10 is arranged on the high temperature side of the temperature gradient; and a Si vapor supply source 25 capable of supplying Si vapor into the main container 20.

Figure 2:
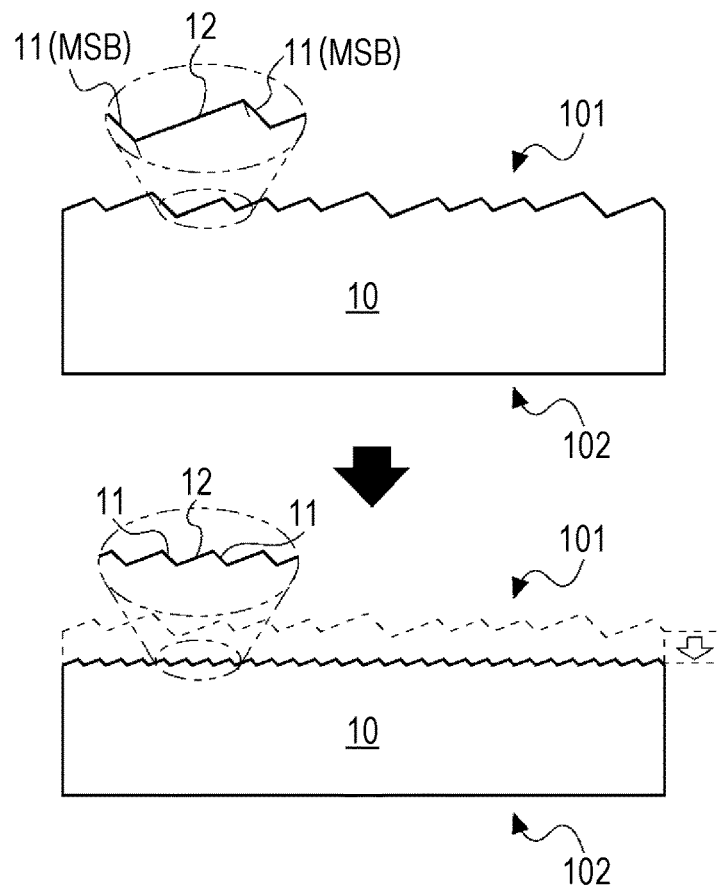
FIG. 2 is an explanatory view of a SiC substrate etched by the device for manufacturing a SiC substrate according to the embodiment.

By using such a device for manufacturing a SiC substrate, as illustrated in FIG. 2, a SiC substrate in which formation of macro-step bunching is suppressed can be manufactured.

<SiC Substrate 10>

Examples of the SiC substrate 10 can include a SiC wafer obtained by slicing a bulk crystal produced by a sublimation method or the like into a disk shape, and a SiC substrate obtained by processing single crystal SiC into a thin plate shape. As the crystal polymorph of the single crystal SiC, any polytype can be adopted.

In the description of the present specification, a surface of the SiC substrate 10 on which the semiconductor element is formed (specifically, a surface on which the epilayer is deposited) is referred to as a main surface 101, and a surface facing the main surface is referred to as a back surface 102. The main surface 101 and the back surface 102 are collectively referred to as a surface, and a direction penetrating the main surface 101 and the back surface 102 is referred to as a front and back direction.

As the main surface 101, a surface provided with an off angle of several degrees (for example, 0.4 to 8°) from a (0001) surface or a (000−1) surface can be exemplified. (In the present specification, in the notation of a Miller index, "−" means a bar attached to the index immediately after the Miller index).

A step-terrace structure is recognized on the surface of the SiC substrate 10 planarized at an atomic level. This step-terrace structure is a staircase structure in which a step 11 which is a step portion of one or more molecular layers and a terrace 12 which is a flat portion where the {0001} surface is exposed are alternately arranged.

In the step 11, one molecular layer (0.25 nm) has a minimum height (minimum unit), and a plurality of the one molecular layer are layered to form various step heights. In the description of the present specification, a step that is obtained by the step 11 becoming large by bundling (bunching) and has a height exceeding one unit cell of each polytype is referred to as macro step bunching (MSB) (hereinafter, referred to as MSB).

That is, the MSB is a step 11 obtained by bunching more than four molecular layers (five or more molecular layers) in the case of 4H-SiC, and is a step 11 obtained by bunching more than six molecular layers (seven or more molecular layers) in the case of 6H-SiC.

The MSB is one of the factors of generation of a defect caused by the MSB on the surface at the time of forming the epilayer and inhibition of oxide film reliability of the MOSFET, and thus, it is desirable that the MSB is not formed on the surface of the SiC substrate 10.

As the size of the SiC substrate 10, a chip size of several centimeters square, a 6-inch wafer or an 8-inch wafer can be exemplified.

<Main Container 20>

It is sufficient that the main container 20 is configured to accommodate the SiC substrate 10 and generate vapor pressure of a gaseous species containing Si element and a gaseous species containing C element in an internal space during the heat treatment. For example, the main container 20 is made of a material containing polycrystalline SiC. In the present embodiment, the entire main container 20 is made of polycrystalline SiC. By heating the main container 20 made of such a material, vapor pressure of a gaseous species containing Si element and a gaseous species containing C element can be generated.

That is, the environment in the heat-treated main container 20 is desirably a vapor pressure environment of a mixed system of a gaseous species containing Si element and a gaseous species containing the C element. Examples of the gaseous species containing Si element include Si, $Si_2$, $Si_3$, $Si_2C$, $SiC_2$, and SiC. Examples of the gaseous species containing the C element include $Si_2C$, $SiC_2$, SiC, and C. That is, the SiC-based gas exists in the main container 20.

The configuration can be adopted as long as the configuration can generate vapor pressure of a gaseous species containing Si element and a gaseous species containing C element in the internal space during the heating treatment of the main container 20. For example, a configuration in which polycrystalline SiC is exposed on a part of the inner surface, a configuration in which polycrystalline SiC is separately arranged in the main container 20, and the like can be shown.

Figure 3:
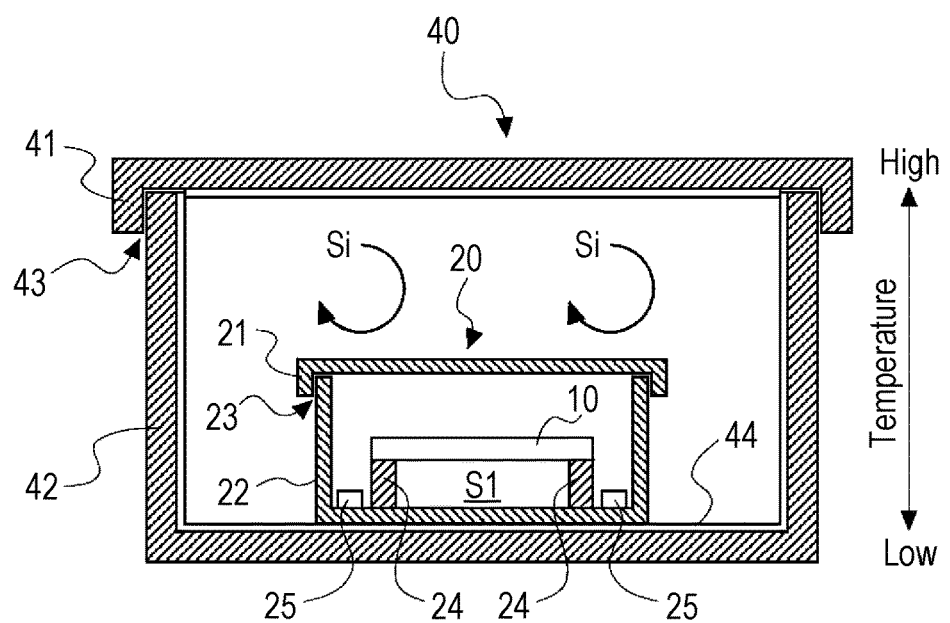
FIG. 3 is an explanatory view of the device for manufacturing the SiC substrate according to the embodiment.

As illustrated in FIG. 3, the main container 20 is a fitting container including an upper container 21 and a lower container 22 that can be fitted to each other. A minute gap 23 is formed in a fitting portion between the upper container 21 and the lower container 22, and the inside of the main container 20 can be exhausted (evacuated) from the gap 23.

The main container 20 includes an etching space S1 formed by making a portion of the main container 20 arranged on the low temperature side of the temperature gradient face the SiC substrate 10 in a state where the SiC substrate 10 is arranged on the high temperature side of the temperature gradient. That is, at least a portion of the main container 20 (for example, the bottom surface of the lower container 22) becomes lower in temperature than the SiC substrate 10 due to the temperature gradient provided in the heating furnace 30, and thereby, the etching space S1 is formed.

The etching space S1 is a space for transporting Si atoms and C atoms on the surface of the SiC substrate 10 to the main container 20 by using a temperature difference provided between the SiC substrate 10 and the main container 20 as a driving force.

Figure 4:
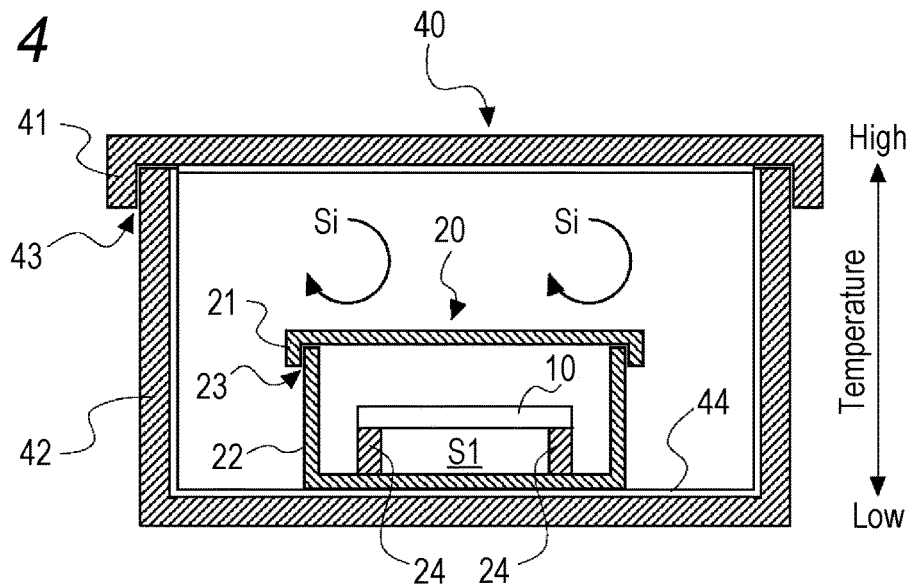
FIG. 4 is an explanatory view of the device for manufacturing the SiC substrate according to the embodiment.

For example, the SiC substrate 10 is arranged such that the temperature on the main surface 101 side is high and the temperature of the bottom surface side of the lower container 22 is low when the temperature of the main surface 101 (or back surface 102) of the SiC substrate 10 is compared with the temperature of the bottom surface of the lower container 22 facing the main surface 101 (see FIGS. 3 and 4). As described above, by forming the space (etching space S1) provided with a temperature difference between the main surface 101 and the bottom surface of the lower container 22, Si atoms and C atoms of the main surface 101 can be transported to the bottom surface of the lower container 22 by using the temperature difference as a driving force.

The main container 20 may include a substrate holder 24 provided between the SiC substrate 10 and the main container 20.

The heating furnace 30 according to the present embodiment is configured to perform heating so as to form a temperature gradient so that the temperature decreases from the upper container 21 toward the lower container 22 of the main container 20. Therefore, by providing the substrate holder 24 capable of holding the SiC substrate 10 between the SiC substrate 10 and the lower container 22, the etching space S1 can be formed between the SiC substrate 10 and the lower container 22.

It is sufficient that the substrate holder 24 is configured to hold at least a part of the SiC substrate 10 in the hollow space of the main container 20. For example, a conventional support means such as a one-point support, a three-point support, a configuration for supporting an outer peripheral edge, or a configuration for clamping a part thereof can be naturally employed. As a material of the substrate holder 24, a SiC material or a high melting point metal material can be adopted.

The substrate holder 24 may not be provided depending on the direction of the temperature gradient of the heating furnace 30. For example, when the heating furnace 30 forms a temperature gradient such that the temperature decreases from the lower container 22 toward the upper container 21, the SiC substrate 10 may be arranged on the bottom surface of the lower container 22 (without providing the substrate holder 24).

The main container 20 includes a Si vapor supply source 25 capable of supplying Si vapor into the main container 20.

It is sufficient that the Si vapor supply source 25 is configured to generate Si vapor in the main container 20 during the heat treatment. Examples of the Si vapor supply source 25 can include solid Si (Si pellet such as Si substrate or Si powder) and a Si compound. The Si vapor supply source 25 is desirably arranged such that the atomic number ratio Si/C in the main container 20 is higher than 1.

For example, when the entire main container 20 is made of polycrystalline SiC and the substrate holder 24 is made of a SiC material as in the present embodiment, it is only necessary to arrange the Si vapor supply source 25. That is, when the SiC substrate 10 satisfying the stoichiometric ratio 1:1, the substrate holder 24 made of SiC satisfying the stoichiometric ratio 1:1, and the Si vapor supply source 25 (Si pellet or the like) are arranged in the main container 20 of polycrystalline SiC satisfying the stoichiometric ratio 1:1, the atomic number ratio Si/C in the main container 20 is higher than 1.

<Heating Furnace 30>

As illustrated in FIG. 1, the heating furnace 30 includes a main heating chamber 31 capable of heating a workpiece (SiC substrate 10 or the like) to a temperature of 1000° C. or higher and 2300° C. or lower; a preheating chamber 32 capable of preheating the workpiece to a temperature of 500° C. or higher; a high melting point container 40 capable of accommodating the main container 20; and a moving unit 33 (moving table) capable of moving the high melting point container 40 from the preheating chamber 32 to the main heating chamber 31.

The main heating chamber 31 has a regular hexagonal shape in planar cross-sectional view, and the high melting point container 40 is arranged inside the main heating chamber 31.

A heater 34 (mesh heater) is provided inside the main heating chamber 31. A multilayer heat reflective metal plate is fixed to a side wall and a ceiling of the main heating chamber 31 (not illustrated). The multilayer heat reflective metal plate is configured to reflect heat of the heater 34 toward a substantially central portion of the main heating chamber 31.

As a result, in the main heating chamber 31, the heater 34 is arranged so as to surround the high melting point container 40 in which the workpiece is accommodated, and the multilayer heat reflective metal plate is arranged on the outer side thereof, so that the temperature can be raised to a temperature of 1000° C. or higher and 2300° C. or lower.

As the heater 34, for example, a resistance heating type heater or a high frequency induction heating type heater can be used.

The heater 34 may adopt a configuration capable of forming a temperature gradient in the high melting point container 40. For example, the heater 34 may be configured such that many heaters are arranged on the upper side (or lower side). Further, the heater 34 may be configured such that the width increases toward the upper side (or lower side). Alternatively, the heater 34 may be configured to be able to increase the power supplied toward the upper side (or lower side).

A vacuum forming valve 35 for exhausting the inside of the main heating chamber 31, an inert gas injection valve 36 for introducing an inert gas into the main heating chamber 31, and a vacuum gauge 37 for measuring the degree of vacuum in the main heating chamber 31 are connected to the main heating chamber 31.

The vacuum forming valve 35 is connected to an evacuation pump that exhausts and evacuates the inside of the main heating chamber 31 (not illustrated). The degree of vacuum in the main heating chamber 31 can be adjusted to, for example, 10 Pa or lower, more preferably 1 Pa or lower, and still more preferably $10^{-3}$ Pa or lower by the vacuum forming valve 35 and the evacuation pump. Examples of the evacuation pump can include a turbo molecular pump.

The inert gas injection valve 36 is connected to an inert gas supply source (not illustrated). By the inert gas injection valve 36 and the inert gas supply source, the inert gas can be introduced into the main heating chamber 31 in the range of $10^{-5}$ to 10000 Pa. As the inert gas, Ar, He, $N_2$, or the like can be selected.

The preheating chamber 32 is connected to the main heating chamber 31, and is configured to be able to move the high melting point container 40 by the moving means 33. The preheating chamber 32 of the present embodiment is configured to be capable of raising the temperature by residual heat of the heater 34 of the main heating chamber 31. For example, when the temperature of the main heating chamber 31 is raised to 2000° C., the temperature of the preheating chamber 32 is raised to about 1000° C., and the object to be processed (SiC substrate 10, main container 20, high melting point container 40, and the like) can be degassed.

The moving means 33 is configured to be able to move the main heating chamber 31 and the preheating chamber 32 with the high melting point container 40 placed thereon. Since the transportation between the main heating chamber 31 and the preheating chamber 32 by the moving means 33 is completed in about 1 minute at the shortest, it is possible to realize temperature rise and temperature drop at 1 to 1000° C./min.

Since the rapid temperature raise and the rapid temperature drop can be performed in this manner, it is possible to observe a surface shape having no low-temperature growth history during temperature rise and temperature drop, which is difficult in conventional devices.

In FIG. 1, the preheating chamber 32 is arranged below main heating chamber 31. However, the present invention is not limited to this, and the preheating chamber 42 may be arranged in any direction.

The moving means 33 according to the present embodiment is a moving table on which the high melting point container 40 is placed. The minute heat is released from the contact portion between the moving table and the high melting point container 40. As a result, a temperature gradient can be formed in the high melting point container 40.

In the heating furnace 30 of the present embodiment, since the bottom of the high melting point container 40 is in contact with the moving table, a temperature gradient is provided so that the temperature decreases from the upper container 41 toward the lower container 42 of the high melting point container 40.

The direction of this temperature gradient can be set to any direction by changing the position of the contact portion between the moving table and the high melting point container 40. For example, in a case where a suspension type or the like is adopted for the moving table and the contact portion is provided on the ceiling of the high melting point container 40, heat is transferred upward. Therefore, the temperature gradient is provided such that the temperature rises from the upper container 41 toward the lower container 42 of the high melting point container 40. This temperature gradient is desirably formed along the front and back direction of the SiC substrate 10.

As described above, the temperature gradient may be formed by the configuration of the heater 34.

<High Melting-Point Container 40>

The vapor pressure environment of the gaseous species containing Si element in the heating furnace 30 according to the present embodiment is formed using the high melting point container 40 and the Si vapor supply source 44. For example, any method capable of forming a vapor pressure environment of a gaseous species containing Si element around the main container 20 can be employed in the device for manufacturing a SiC substrate of the present invention.

The high-melting-point container 40 contains a high melting point material. For example, C which is a general-purpose heat-resistant member, W, Re, Os, Ta, and Mo which are high melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, $TiB_2$ which are borides, polycrystalline SiC, and the like can be exemplified.

As similar to the main container 20, the high melting point container 40 is a fitting container including an upper container 41 and a lower container 42 that can be fitted to each other, and is configured to be able to accommodate the main container 20. A minute gap 43 is formed in a fitting portion between the upper container 41 and the lower container 42, and the inside of the high melting point container 40 can be exhausted (evacuated) from the gap 43.

The high melting point container 40 preferably includes a Si vapor supply source 44 capable of supplying vapor pressure of a vapor phase species containing Si element into the high melting point container 40. It is sufficient that the Si vapor supply source 44 is configured to generate a vapor pressure of a gaseous species containing Si element in the high melting point container 40 at the time of heat treatment, and for example, solid Si (Si pellet such as a single crystal Si piece or Si powder) or a Si compound can be exemplified.

The device for manufacturing a SiC substrate according to the present embodiment employs TaC as the material of the high melting point container 40, and employs tantalum silicide as the Si vapor supply source 44. That is, as illustrated in FIGS. 3 and 4, a tantalum silicide layer is formed inside the high melting point container 40, and Si vapor is supplied into the container from the tantalum silicide layer during the heat treatment, so that a Si vapor pressure environment is formed.

In addition, any configuration can be adopted as long as the vapor pressure of the gaseous species containing Si element is formed in the high melting point container 40 during the heat treatment.

a device for manufacturing a SiC substrate according to the present invention includes: a main container 20 capable of accommodating a SiC substrate 10 and configured to generate vapor pressure of a gaseous species containing Si element and a gaseous species containing C element in an internal space by heating; and a heating furnace 30 that accommodates the main container 20, generates vapor pressure of a gaseous species containing Si element in an internal space, and performs heating in a manner to form a temperature gradient, the main container 20 including an etching space S1 formed by making a portion of the main container 20 arranged on a low temperature side of the temperature gradient face the SiC substrate 10 in a state where the SiC substrate 10 is arranged on a high temperature side of the temperature gradient, and a Si vapor supply source 25 capable of supplying Si vapor into the main container 20.

A near thermal equilibrium state can be formed between the SiC substrate 10 and the main container 20, and a SiC—Si equilibrium vapor pressure environment can be formed in the main container 20. In such an environment, mass transport occurs using the temperature gradient of the heating furnace 30 as a driving force, and the SiC substrate 10 is etched, so that it is possible to manufacture the SiC substrate in which the formation of the MSB is suppressed.

According to the SiC substrate manufacturing device according to the present embodiment, the main container 20 is heated under the vapor pressure environment (for example, the Si vapor pressure environment) of the gaseous species containing Si element, and thereby, the gaseous species containing Si element can be suppressed from being exhausted from the inside of the main container 20. That is, by balancing the vapor pressure of the gaseous species containing Si element in the main container 20 and the vapor pressure of the gaseous species containing Si element outside the main container 20, the environment in the main container 20 can be maintained.

In other words, the main container 20 is arranged in the high melting point container 40 in which a vapor pressure environment (for example, a Si vapor pressure environment) of a gaseous species containing Si element is formed. As described above, the inside of the main container 20 is exhausted (evacuated) via the vapor pressure environment (for example, the Si vapor pressure environment) of the gaseous species containing Si element, so that it is possible to suppress a decrease in Si atoms from the inside of the etching space S1. As a result, the atomic number ratio Si/C preferable for etching can be maintained in the etching space S1 for a long time.

According to the device for manufacturing a SiC substrate according to the present embodiment, the main container 20 is made of polycrystalline SiC. With such a configuration, when the main container 20 is heated using the heating furnace 30, only the vapor pressure of the gaseous species containing Si element and the gaseous species containing the C element can be generated in the main container 20.

[Method for Manufacturing SiC Substrate]

Hereinafter, a method for manufacturing a SiC substrate according to an embodiment of the present invention will be described in detail.

A method for manufacturing a SiC substrate according to the present embodiment includes an etching process of etching a SiC substrate 10 by accommodating the SiC substrate 10 and a Si vapor supply source 25 inside a main container 20 that generates vapor pressure of a gaseous species containing Si element and a gaseous species containing C element in an internal space, and performing heating the main container 20 in a manner to form a temperature gradient under an environment of vapor pressure of the gaseous species containing Si element.

In this embodiment, the same reference signs are given to components that are basically the same as those in the above device for manufacturing a SiC substrate, and the description thereof will be simplified.

Hereinafter, the etching process of the method for manufacturing a SiC substrate according to the present embodiment will be described in detail.

<Etching Process>

It is considered that, by heating the main container 20 in which the SiC substrate 10 is arranged in a temperature range of equal to or higher than 1400° C. and equal to or lower than 2300° C., the reactions of the following 1) to 5) are continuously performed, and as a result, etching proceeds.

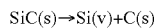  1)

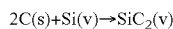  2)

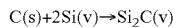  3)

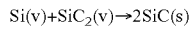  4)

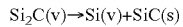  5)

Explanation of 1): When the SiC substrate 10 (SiC(s)) is heated, Si atoms (Si (v)) are desorbed from the surface of the SiC substrate 10 by thermal decomposition (Si atom sublimation process).

Explanation of 2) and 3): C (C(s)) remaining on the surface of the SiC substrate 10 due to desorption of Si atoms (Si(v)) reacts with Si vapor (Si(v)) in the main container 20 to become $Si_2C$, $SiC_2$, or the like, and is sublimated in the main container 20 (C atom sublimation process).

Explanation of 4) and 5): Sublimated $Si_2C$, $SiC_2$, or the like reaches the bottom surface (polycrystalline SiC) in the main container 20 by a temperature gradient and grows.

That is, the etching process includes a Si atom sublimation process of thermally sublimating Si atoms from the surface of the SiC substrate 10, and a C atom sublimation process of sublimating C atoms from the surface of the SiC substrate 10 by reacting C atoms remaining on the surface of the SiC substrate 10 with Si vapor in the main container 20.

In the etching process, the SiC substrate 10 arranged on the high temperature side of the temperature gradient and a portion of the main container 20 arranged on the low temperature side of the temperature gradient are etched while facing each other.

That is, the etching space S1 is formed between the main surface 101 of the SiC substrate 10 and the bottom surface of the main container 20 lower in temperature than the main surface 101 by arranging the main surface 101 and the bottom surface to face each other. In the etching space S1, mass transport occurs using the temperature gradient formed by the heating furnace 30 as a driving force, and as a result, the SiC substrate 10 can be etched.

In other words, in the etching process, the SiC substrate 10 and a portion of the main container 20 are arranged to face each other, and heating is performed with a temperature gradient so that a portion of the main container 20 is on the low temperature side and the SiC substrate 10 is on the high temperature side. With this temperature gradient, the Si element and the C element are transported from the SiC substrate 10 to the main container 20, and the SiC substrate 10 is etched.

The etching process according to the present invention is characterized by etching the SiC substrate 10 under a SiC—Si equilibrium vapor pressure environment. Hereinafter, the SiC—Si equilibrium vapor pressure environment and the SiC—C equilibrium vapor pressure environment will be described in detail.

The SiC—Si equilibrium vapor pressure environment and the SiC—C equilibrium vapor pressure environment in the present specification include a near-thermal equilibrium vapor pressure environment that satisfies the relationship between the etching rate and the etching temperature derived from the theoretical thermal equilibrium environment.

The SiC—Si vapor pressure environment refers to an environment of vapor pressure when SiC (solid) and Si (liquid phase) are in a phase equilibrium state via a gas phase.

The SiC—Si equilibrium vapor pressure environment is formed, for example, by heat-treating a semi-closed space in which the atomic number ratio Si/C is higher than 1.

The "semi-closed space" in the present specification refers to a space in which the inside of the container can be evacuated but at least a part of the steam generated in the container can be confined. The semi-closed space can be formed in the main container 20 or in the high melting point container 40.

The SiC—C equilibrium vapor pressure environment refers to an environment of vapor pressure when SiC (solid phase) and C (solid phase) are in a phase equilibrium state via a gas phase.

The SiC—C equilibrium vapor pressure environment is formed, for example, by heat-treating a semi-closed space in which the atomic number ratio Si/C is equal to or lower than 1.

The atomic number ratio Si/C in the gas phase in the SiC—Si equilibrium vapor pressure environment is larger than the atomic number ratio Si/C in the gas phase in the SiC—C equilibrium vapor pressure environment.

Hereinafter, the etching space S1 (FIG. 3) in the main container 20 in which the SiC—Si equilibrium vapor pressure environment is formed will be described in detail with reference to the etching space S1 (FIG. 4) in the main container 20 in which the SiC—C equilibrium vapor pressure environment is formed.

The etching space S1 in which the SiC—Si equilibrium vapor pressure environment is formed can be formed by arranging and heating the Si vapor supply source 25 such that the atomic number ratio Si/C in the main container 20 is higher than 1 before the heating treatment.

For example, as illustrated in FIG. 3, when the SiC substrate 10 satisfying the stoichiometric ratio 1:1, the substrate holder 24 made of SiC satisfying the stoichiometric ratio 1:1, and the Si vapor supply source 25 (Si pellet or the like) are arranged in the main container 20 of polycrystalline SiC satisfying the stoichiometric ratio 1:1, the atomic number ratio Si/C in the main container 20 is higher than 1.

On the other hand, the etching space S1 in which the SiC—C equilibrium vapor pressure environment is formed can be formed by arranging and heating the etching space S1 so that the atomic number ratio Si/C in the etching space S1 is equal to or lower than 1 before the heating treatment.

For example, as illustrated in FIG. 4, when the SiC substrate 10 satisfying the stoichiometric ratio 1:1, and the substrate holder 24 made of SiC satisfying the stoichiometric ratio 1:1 are arranged in the main container 20 of polycrystalline SiC satisfying the stoichiometric ratio 1:1, the atomic number ratio Si/C in the main container 20 is equal to or lower than 1.

In order to reduce the atomic number ratio Si/C in the etching space S1, a C vapor supply source may be separately arranged, or the main container 20 including the C vapor supply source or the substrate holder 24 may be adopted. Examples of the C vapor supply source can include solid C (C pellet such as a C substrate and a C powder) and a C compound.

The etching temperature in this method is preferably set in a range of 1400 to 2300° C., and more preferably set in a range of 1600 to 2000° C.

The etching rate in this method can be controlled by the above temperature range, and can be selected in the range of 0.001 to 2 μm/min.

For the etching amount in this method, any etching amount can be adopted as long as the MSB of the SiC substrate 10 can be decomposed. As the etching amount, equal to or higher than 0.1 μm and equal to or lower than 20 μm can be exemplified, but the etching amount can be applied as necessary.

The etching time in this method can be set to any time so as to obtain a desired etching amount. For example, when the etching rate is 1 μm/min and the etching amount is desired to be 1 μm, the etching time is 1 minute.

The temperature gradient in this method is set in the range of 0.1 to 5° C./mm in the etching space S1.

EXAMPLES

SiC substrates of Example 1 and Comparative Example 1 were manufactured by the following method.

Example 1

Figure 5:
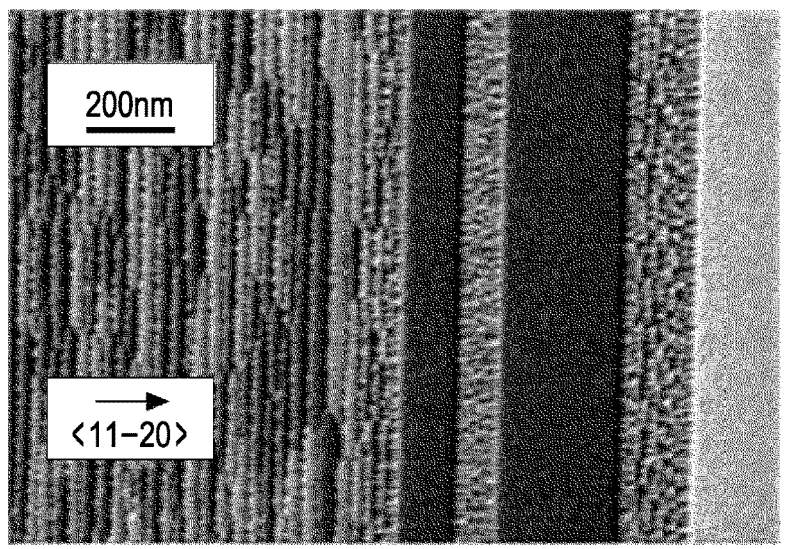
FIG. 5 is a SEM image of a surface of a SiC substrate before an etching process of a method for manufacturing a SiC substrate according to an embodiment.

The SiC substrate 10 was accommodated in the main container 20 and the high melting point container 40 under the following conditions (arranging process).
[SiC Substrate 10]
  Polymorphism: 4H-Sic
  Substrate size: width 10 mm×length 10 mm×thickness 0.3 mm
  Off direction and off angle: <11–20> direction 4° off
  Etching surface: (0001) surface
  Presence or absence of MSB: Present
FIG. 5 is a SEM image of the surface of the SiC substrate 10 before the etching process. The MSB having a height of equal to or higher than 3 nm is formed on the surface of the SiC substrate 10 before the etching process. The height of step 11 was measured by AFM.
[Main Container 20]
  Material: polycrystalline SiC
  Container size: diameter 60 mm×height 4 mm
  Material of substrate holder 24: single crystal SiC
  Distance between SiC substrate 10 and bottom surface of main container 20: 2 mm
  Si vapor supply source 25: single crystal Si piece
[High Melting Point Container 40]
  Material: TaC
  Container size: diameter 160 mm×height 60 mm
  Si vapor supply source 44 (Si compound): $TaSi_2$
[Etching Process]

Figure 6:
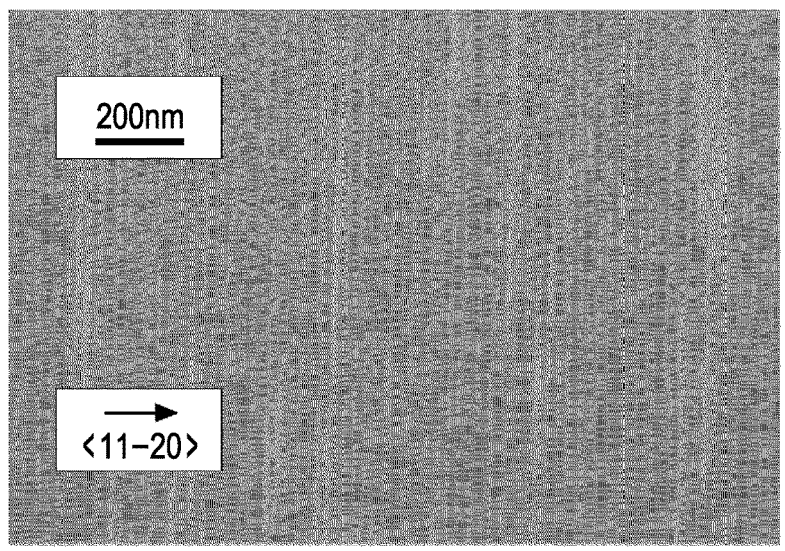
FIG. 6 is a SEM image of a surface of a SiC substrate observed in Example 1 of the method for manufacturing a SiC substrate according to the embodiment.

The SiC substrate 10 arranged under the above conditions was subjected to heat treatment under the following conditions.
  Heating temperature: 1900° C.
  Heating time: 60 min
  Etching rate: 300 nm/min
  Vacuum degree of main heating chamber: $10^{-5}$ Pa FIG. 6 is a SEM image of the surface of the SiC substrate 10 of Example 1 etched under the above conditions.

It can be seen that the MSB is not formed on the surface of the SiC substrate 10 of Example 1, and the steps 11 of 1.0 nm (full unit cell) are regularly arranged.

In Example 1, the Si vapor supply source 25 is arranged such that the atomic number ratio Si/C in the main container 20 is higher than 1 (see FIG. 3). As a result, a SiC—Si equilibrium vapor pressure environment is formed in the main container 20. By etching the SiC substrate 10 under the SiC—Si equilibrium vapor pressure environment, the SiC substrate 10 in which the formation of the MSB is suppressed can be manufactured.

Comparative Example 1

The SiC substrate 10 was accommodated in the main container 20 and the high melting point container 40 under the following conditions (arranging process).
[SiC Substrate 10]
  A SiC substrate 10 similar to that of Example 1 was used.
[Main Container 20]
  A main container 20 similar to that of Example 1 was used. At this time, the Si vapor supply source 25 (single crystal Si piece) was not arranged, and only the SiC substrate 10 was arranged in the main container 20 (see FIG. 4).
[High Melting Point Container 40]
  A high melting point container 40 and a Si vapor supply source 44 (Si compound) similar to those of Example 1 were used.
[Etching Process]

The SiC substrate 10 arranged under the above conditions was etched under the same conditions as in Example 1.

Figure 7:
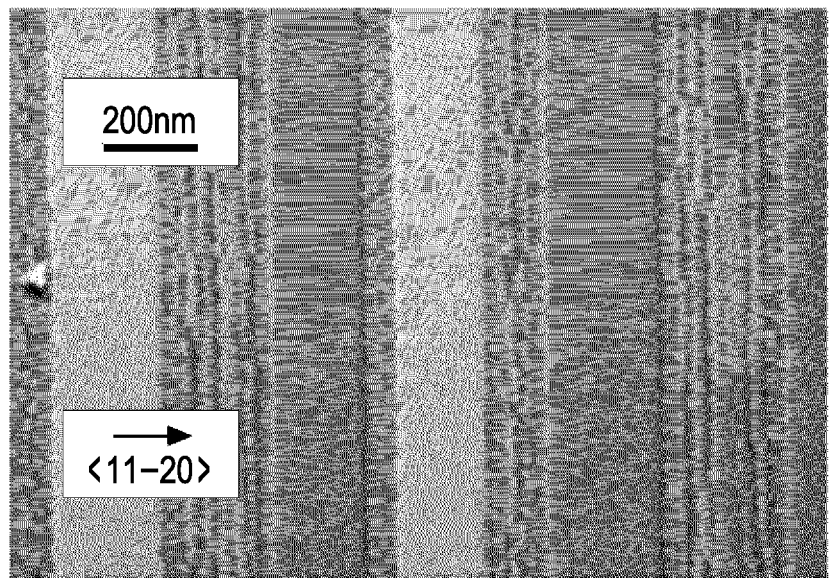
FIG. 7 is a SEM image of a surface of a SiC substrate observed in Comparative Example 1 of the method for manufacturing a SiC substrate according to the embodiment.

FIG. 7 is a SEM image of the surface of the SiC substrate 10 of Comparative Example 1 etched under the above conditions.

The MSB having a height of equal to or higher than 3 nm is formed on the surface of the SiC substrate 10 of Comparative Example 1.

In Comparative Example 1, members are arranged such that the atomic number ratio Si/C in the main container 20 is equal to or lower than 1 (see FIG. 4). As a result, a SiC—C equilibrium vapor pressure environment is formed in the main container 20.

Figure 8:
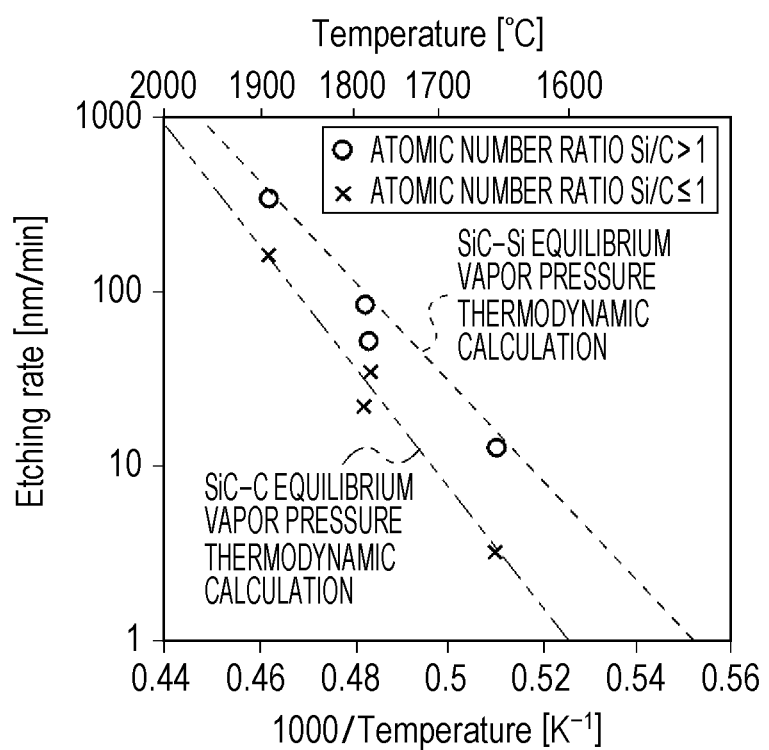
FIG. 8 is a graph for explaining an environment inside a main container in the etching process of the method for manufacturing a SiC substrate according to the embodiment.

FIG. 8 is a graph illustrating a relationship between a heating temperature and an etching rate when etching is performed by the method for manufacturing a SiC substrate according to the present invention. The horizontal axis of this graph represents the reciprocal of the temperature, and the vertical axis of this graph represents logarithmic etching rate. The result of etching with the atomic number ratio Si/C in the etching space S1 set to be higher than 1 (see FIG. 3) is indicated by ○, and the result of etching with the atomic number ratio Si/C in the etching space S1 set to be equal to or lower than 1 (1 or less than 1) (see FIG. 4) is indicated by x. The MSB was not formed on the surface of the SiC substrate 10 at the points marked with ○, and step 11 was the height of one unit cell. On the other hand, the MSB was formed on the surface of the SiC substrate 10 at the points marked with x.

When vapor pressure of a gaseous species containing Si element and a gaseous species containing C element generated from the SiC substrate 10 at the time of heating the inside of the main container 20 are defined as etching amounts, an etching rate of the SiC substrate 10 is obtained by the following Mathematical formula 1.

$$\text{Etching rate } (m/s) \alpha \sum_{i=SiC, Si_2C, SiC_2} \frac{P_i}{\sqrt{2\pi m_i kT}} \quad \text{[Mathematical formula 1]}$$

Here, T is a temperature on the SiC substrate 10, mi is a molecular weight of a gaseous species ($Si_xC_y$), and k is a Boltzmann constant.

$P_i$ is a value obtained by adding the vapor pressure generated in the main container 20 when the SiC substrate 10 is heated. SiC, $Si_2C$, $SiC_2$, and the like are assumed as the gaseous species of $P_i$.

In the graph of FIG. 8, the result of the thermodynamic calculation of the SiC substrate etching in the SiC—Si equilibrium vapor pressure environment is indicated by a broken line (Arrhenius plot), and the result of the thermodynamic calculation of the SiC substrate etching in the SiC—C equilibrium vapor pressure environment is indicated by a two-dot chain line (Arrhenius plot).

That is, the broken line is a result of thermodynamic calculation when the single crystal SiC is etched in a vapor pressure environment when SiC (solid) and Si (liquid phase) are in a phase equilibrium state via a gas phase. Specifically, using Mathematical formula 1, thermodynamic calculation was performed under the following conditions (i) to (iv). (i) The environment is a constant volume SiC—Si equilibrium vapor pressure environment, (ii) an etching driving force is a temperature gradient in the etching space S1, (iii) source gases are SiC, $Si_2C$, and $SiC_2$, and (iv) a desorption coefficient at which the source sublimates from the step 11 is 0.001.

The two-dot chain line is a result of thermodynamic calculation when the single crystal SiC is etched in a vapor pressure environment when SiC (solid phase) and C (solid phase) are in a phase equilibrium state via a gas phase. Specifically, using Mathematical formula 1, thermodynamic calculation was performed under the following conditions (i) to (iv). (i) The environment is a constant volume SiC—C equilibrium vapor pressure environment, (ii) an etching driving force is a temperature gradient in the etching space S1, (iii) source gases are SiC, $Si_2C$, and $SiC_2$, and (iv) a desorption coefficient at which the source sublimates from the step 11 is 0.001.

As the data of each chemical species used for the thermodynamic calculation, the values in the JANAF thermochemical table were adopted.

As a result, it can be seen that under the condition of the mark ○ in FIG. 8 etched under the SiC—Si equilibrium vapor pressure environment, the formation of the MSB is decomposed and suppressed, and the steps 11 of 1 nm (1 unit cell) in height are aligned on the surface of the SiC substrate 10.

On the other hand, it can be seen that the MSB is formed under the condition of the mark x in FIG. 8 etched under the SiC—C equilibrium vapor pressure environment.

According to the method for manufacturing a SiC substrate of the present invention, by including the etching process of etching the SiC substrate 10 under the SiC—Si equilibrium vapor pressure environment, it is possible to manufacture the SiC substrate in which the formation of the MSB is suppressed.

REFERENCE SIGNS LIST

10 SiC substrate
101 Main surface
11 Step
12 Terrace
20 Main container
24 Substrate holder
25 Si vapor supply source
30 Heating furnace
40 High melting point container
44 Si vapor supply source
S1 Etching space

The invention claimed is:
1. A method for manufacturing a SiC substrate comprising an etching process of etching a SiC substrate under a SiC—Si equilibrium vapor pressure environment by accommodating the SiC substrate inside a main container made of a material containing SiC that generates vapor pressure of a gaseous species containing Si element and a gaseous species containing C element in an internal space, and heating the main container so that a portion of the main container is arranged on a low temperature side of a temperature gradient and the SiC substrate is arranged on a high temperature side of the temperature gradient under an environment of vapor pressure of the gaseous species containing Si element.

2. The method for manufacturing a SiC substrate according to claim 1, wherein a Si vapor supply source is arranged inside the main container.

3. The method for manufacturing a SiC substrate according to claim 1, wherein the etching process includes
  a Si atom sublimation process of thermally sublimating Si atoms from a surface of the SiC substrate, and
  a C atom sublimation process of sublimating C atoms from the surface of the SiC substrate by reacting C atoms remaining on the surface of the SiC substrate with Si vapor in the main container.

4. The method for manufacturing a SiC substrate according to claim 1, wherein, in the etching process, the SiC substrate arranged on a high temperature side of the temperature gradient and a portion of the main container arranged on a low temperature side of the temperature gradient are etched while facing each other.

5. A method for reducing macro-step bunching of a SiC substrate comprising an etching process of etching a SiC substrate in a main container made of a material containing SiC under a SiC—Si equilibrium vapor pressure environment,
  wherein the etching process is a process in which a portion of the main container is arranged on a low temperature side of a temperature gradient and the SiC substrate is arranged on a high temperature side of the temperature gradient.

6. The method according to claim 5, wherein the etching process is a process of performing heating in a temperature range of equal to or higher than 1400° C. and equal to or lower than 2300° C.

7. The method according to claim 5, wherein the etching process is a process of performing etching by arranging a Si vapor supply source in a manner that an atomic number ratio Si/C in an etching space is higher than 1.

8. A method for manufacturing a SiC substrate comprising
an etching process of etching a SiC substrate by heating the SiC substrate in a main container made of a material containing SiC under a SiC—Si equilibrium vapor pressure environment, wherein
the etching process is a process of performing etching by arranging the SiC substrate in an etching space exhausted through an environment of vapor pressure of a gaseous species containing Si element and heating the SiC substrate so that the SiC substrate is arranged on a high temperature side of a temperature gradient.

9. The method for manufacturing a SiC substrate according to claim 8, wherein the etching process is a process of performing etching by arranging a Si vapor supply source in a manner that an atomic number ratio Si/C in the etching space is higher than 1.

* * * * *